(12) United States Patent
Zeng et al.

(10) Patent No.: US 9,047,982 B2
(45) Date of Patent: Jun. 2, 2015

(54) DATA COMPENSATING METHOD FOR FLASH MEMORY

(71) Applicant: LITE-ON TECHNOLOGY CORPORATION, Taipei (TW)

(72) Inventors: Shih-Jia Zeng, Hsinchu (TW); Chien-Fu Tseng, Hsinchu (TW); Hsie-Chia Chang, Hsinchu (TW); Yen-Yu Chou, Hsinchu (TW)

(73) Assignee: LITE-ON TECHNOLOGY CORPORATION, Taipei (TW)

( * ) Notice: Subject to any disclaimer, the term of this patent is extended or adjusted under 35 U.S.C. 154(b) by 188 days.

(21) Appl. No.: 13/727,939

(22) Filed: Dec. 27, 2012

(65) Prior Publication Data

US 2014/0133225 A1    May 15, 2014

(30) Foreign Application Priority Data

Nov. 12, 2012  (CN) .......................... 2012 1 0449187

(51) Int. Cl.
| | |
|---|---|
| *G11C 16/34* | (2006.01) |
| *G11C 11/56* | (2006.01) |
| *G06F 11/10* | (2006.01) |
| *G11C 16/04* | (2006.01) |

(52) U.S. Cl.
CPC ........ *G11C 11/5628* (2013.01); *G11C 16/3418* (2013.01); *G11C 16/3422* (2013.01); *G11C 16/3431* (2013.01); *G06F 11/1048* (2013.01); *G11C 16/0483* (2013.01)

(58) Field of Classification Search
CPC ........... G11C 16/3418; G11C 16/3422; G11C 16/3427; G11C 16/3431; G11C 16/0483; G06F 11/1048
USPC ........................................ 365/185.02, 185.09
See application file for complete search history.

(56) References Cited

U.S. PATENT DOCUMENTS

| | | | | |
|---|---|---|---|---|
| 8,427,875 | B2 * | 4/2013 | Yang | 365/185.18 |
| 8,587,997 | B2 * | 11/2013 | Kim et al. | 365/185.02 |
| 2011/0216598 | A1 * | 9/2011 | Kim et al. | 365/185.18 |
| 2011/0239089 | A1 * | 9/2011 | Haratsch et al. | 714/763 |

\* cited by examiner

*Primary Examiner* — Vanthu Nguyen
(74) *Attorney, Agent, or Firm* — WPAT, PC; Justin King (57) ABSTRACT

A data compensating method for a flash memory is provided. Firstly, a first threshold voltage distribution curve of the cells of the flash memory with a first storing state is acquired. Then, a second threshold voltage distribution curve of the cells of the flash memory with a second storing state is acquired. Then, a first occurrence probability of a first type ICI pattern of the first storing state is calculated according to a statistic voltage range and the first threshold voltage distribution curve. A second occurrence probability of the first type ICI pattern of the second storing state is acquired according to the statistic voltage range and the second threshold voltage distribution curve. During a read cycle, storing states of central cells corresponding to the first type ICI pattern are compensated according to the first occurrence probability and the second occurrence probability.

13 Claims, 7 Drawing Sheets

| ICI pattern | 1 | 2 | 3 | 4 | 5 | 6 | 7 | 8 | 9 | 10 | 11 | 12 | 13 |
|---|---|---|---|---|---|---|---|---|---|---|---|---|---|
| Frequency | 0 | 1 | 0 | 9 | 0 | 0 | 0 | 0 | 0 | 35 | 0 | 0 | 0 |
| ⋮ | | | | | | | | | | | | | |
| ICI pattern | 52 | 53 | 54 | 55 | 56 | 57 | 58 | 59 | 60 | 61 | 62 | 63 | 64 |
| Frequency | 10 | 0 | 0 | 0 | 105 | 0 | 0 | 0 | 78 | 0 | 0 | 12 | 0 |

| ICI pattern | 1 | 2 | 3 | 4 | 5 | 6 | 7 | 8 | 9 | 10 | 11 | 12 | 13 |
|---|---|---|---|---|---|---|---|---|---|---|---|---|---|
| Frequency | 0 | 155 | 0 | 0 | 0 | 0 | 0 | 17 | 0 | 0 | 0 | 0 | 25 |
| ⋮ | | | | | | | | | | | | | |
| ICI pattern | 52 | 53 | 54 | 55 | 56 | 57 | 58 | 59 | 60 | 61 | 62 | 63 | 64 |
| Frequency | 33 | 0 | 0 | 0 | 2 | 0 | 0 | 0 | 60 | 0 | 0 | 0 | 8 |

The first occurrence probability of the first type ICI pattern of the first storing state is larger than the second occurrence probability of the first type ICI pattern of the second storing state

S801

During the read cycle, the central cells having the first type ICI pattern of the second storing state and having the threshold voltage within the statistic voltage range are changed to have the first storing state

S803

FIG. 8A $P_{B,\text{first ICI}} > P_{C,\text{first ICI}}$

FIG. 8B

DATA COMPENSATING METHOD FOR FLASH MEMORY

This application claims the benefit of People's Republic of China Application Serial No. 201210449187.4, filed Nov. 12, 2012, the subject matter of which is incorporated herein by reference.

FIELD OF THE INVENTION

The present invention relates to a controlling method for a flash memory, and more particularly to a data compensating method for a flash memory.

BACKGROUND OF THE INVENTION

As is well known, the data storage devices using NAND-based flash memories are widely used in a variety of electronic devices. For example, a SD card or a solid state drive (SSD) is a data storage device that uses a NAND-based flash memory to store data.

Depending on the data amount to be stored, the NAND-based flash memories may be classified into three types, i.e. a single-level cell (SLC) flash memory, a multi-level cell (MLC) flash memory and a triple-level cell (TLC) flash memory. The SLC flash memory can store only one bit of data per cell. The MLC flash memory can store two bits of data per cell. The TLC flash memory can store three bits of data per cell.

Figure 1:
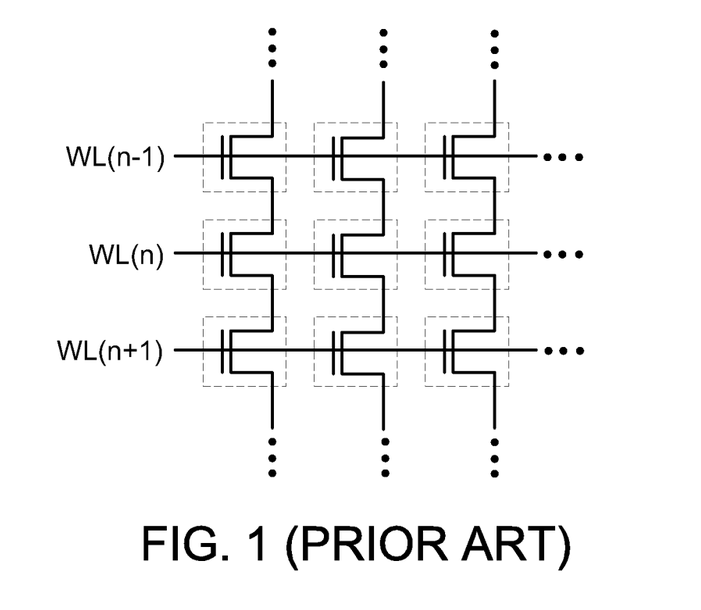
FIG. 1 (prior art) schematically illustrates the architecture of cells of a flash memory.

FIG. 1 schematically illustrates the architecture of cells of a flash memory. As shown in FIG. 1, the flash memory comprises plural cells. The flash memory is a SLC flash memory, a MLC flash memory or a TLC flash memory. Each cell comprises a floating gate transistor. Moreover, these cells of the flash memory are arranged in several columns. The cells arranged in the same column are connected with each other. Moreover, the cells arranged in the same row are connected with a corresponding word line.

Generally, the floating gate transistor of each cell has a floating gate to store hot carriers. A threshold voltage ($V_{TH}$) of the floating gate transistor is determined according to the amount of the stored hot carriers. If a floating gate transistor has a higher threshold voltage, it means that a higher gate voltage is required to turn on the floating gate transistor. Whereas, if a floating gate transistor has a lower threshold voltage, it means that the floating gate transistor can be turned on by a lower gate voltage.

During a program cycle of the flash memory, the threshold voltage of the floating gate transistor may be changed by controlling the amount of hot carriers to be injected into the floating gate. During a read cycle, a sensing circuit of the flash memory may judge the storing status of the floating gate transistor according to the threshold voltage of the floating gate transistor.

Figure 2:
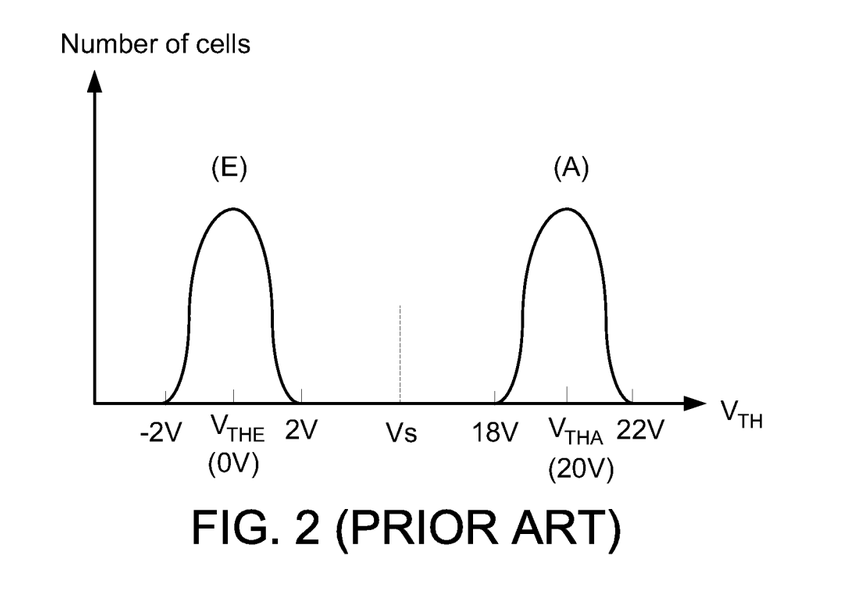
FIG. 2 (prior art) schematically illustrates the threshold voltage distribution curves of the SLC flash memory in different storing states.

FIG. 2 schematically illustrates the threshold voltage distribution curves of the SLC flash memory in different storing states. Before the hot carriers are injected into the cell, the cell has a storing state E. After the hot carriers are injected into the cell, the cell has a storing state A. The storing state A is a high-level state, and the storing state E is a low-level state.

In practical, even if many cells are in the same storing state, the threshold voltages of these cells are not all identical. That is, the threshold voltages of these cells are distributed in a specified distribution curve with a median threshold voltage. For example, the cells in the storing state E (e.g. the logic state is 1) have a median threshold voltage $V_{THE}$ (e.g. 0V), and the cells in the storing state A (e.g. the logic state is 0) have a median threshold voltage $V_{THA}$ (e.g. 20V).

Please refer to FIG. 2 again. A greater number of the cells in the storing state E has the median threshold voltage $V_{THE}$ (e.g. 0V), but the threshold voltages of a smaller number of cells in the storing state E are slightly higher or lower than the median threshold voltage $V_{THE}$ (e.g. in the range between 2V and −2V). Similarly, a greater number of the cells in the storing state A has the median threshold voltage $V_{THA}$ (e.g. 20V), but the threshold voltages of a smaller number of cells in the storing state A are slightly higher or lower than the median threshold voltage $V_{THA}$ (e.g. in the range between 18V and 22V).

According to the above characteristics, a slicing voltage Vs is applied to the word line during the read cycle, and the storing state of each cell may be realized by judging whether the cell is turned on. As shown in FIG. 2, the magnitude of the slicing voltage Vs is between the distribution curve of the storing state E and the distribution curve of the storing state A. For example, the slicing voltage Vs is 12V. If the cell can be turned on, the storing state of the cell is in the storing state E. Whereas, if the cell fails to be turned on, the storing state of the cell is in the storing state A.

Figure 3:
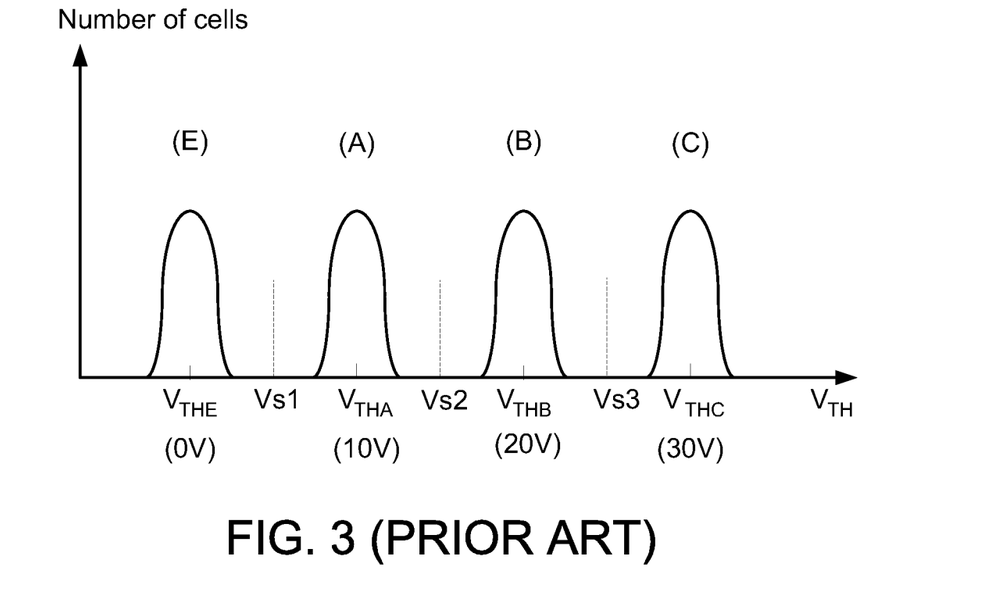
FIG. 3 (prior art) schematically illustrates the threshold voltage distribution curves of the MLC flash memory in different storing states.

FIG. 3 schematically illustrates the threshold voltage distribution curves of the MLC flash memory in different storing states. Each cell of the MLC flash memory has four storing states E, A, B and C. Before the hot carriers are injected into the cell, the cell is in a storing state E (e.g. the logic state is 11). As the number of hot carriers injected into the cell is gradually increased, the cell is sequentially switched to the storing state A (e.g. the logic state is 10), the storing state B (e.g. the logic state is 00) and the storing state C (e.g. the logic state is 01). Moreover, the voltage level in the storing state C>the voltage level in the storing state B>the voltage level in the storing state A>the voltage level in the storing state E.

Similarly, even if many cells are in the same storing state, the threshold voltages of these cells are not all identical. That is, the threshold voltages of these cells are distributed in a specified distribution curve with a median threshold voltage. As shown in FIG. 3, the cells in the storing state E have a median threshold voltage $V_{THE}$ (e.g. 0V), the cells in the storing state A have a median threshold voltage $V_{THA}$ (e.g. 10V), the cells in the storing state B have a median threshold voltage $V_{THB}$ (e.g. 20V), and the cells in the storing state C have a median threshold voltage $V_{THC}$ (e.g. 30V).

Consequently, during the read cycle, a first slicing voltage Vs1, a second slicing voltage Vs2 and a third slicing voltage Vs3 are provided for detecting the four storing states of the MLC flash memory. The magnitude of each slicing voltage is between the distribution curves of two adjacent storing states.

Similarly, the storing states of the cells of the TLC flash memory are distinguished according to the above approaches, and are not redundantly described herein.

However, after the flash memory has been erased many times, the characteristics of the cells are gradually suffered from degradation. Under this circumstance, the threshold voltages of the cells are obviously shifted. The worse is that the threshold voltages of some cells are possibly higher than the pre-defined slicing voltage. Under this circumstance, the storing states of the cells may be erroneously judged during the read cycle. Hereinafter, the conditions of erroneously judging the storing states of the cells will be illustrated by referring to the MLC flash memory.

Figure 4:
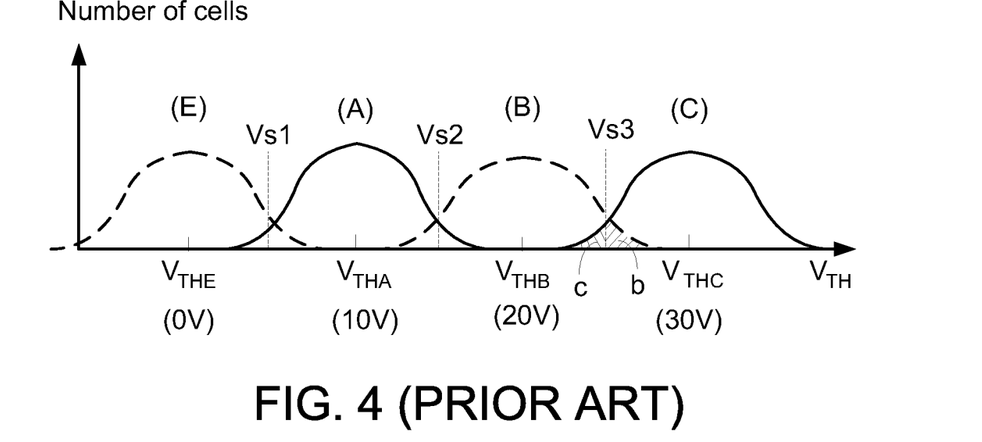
FIG. 4 (prior art) schematically illustrates the threshold voltage distribution curves of the MLC flash memory in different storing states after the MLC flash memory has been erased many times.

FIG. 4 schematically illustrates the threshold voltage distribution curves of the MLC flash memory in different storing states after the MLC flash memory has been erased many times. For example, if the characteristics of the cells are gradually suffered from degradation after the flash memory has been erased many times, the threshold voltages of some cells in the storing state B are higher than the pre-defined third slicing voltage Vs3, and the threshold voltages of some cells in the storing state C are lower than the pre-defined third slicing voltage Vs3. For example, the threshold voltage of the area b under the distribution curve of the storing state B is higher than the third slicing voltage Vs3. If the third slicing voltage Vs3 is employed to judge the storing state, the cells of the area b are erroneously judged to be in the storing state C. Similarly, the threshold voltage of the area c under the distribution curve of the storing state C is lower than the third slicing voltage Vs3. If the third slicing voltage Vs3 is employed to judge the storing state, the cells of the area c are erroneously judged to be in the storing state B.

From the above discussions, as the characteristics of the cells are gradually suffered from degradation, the threshold voltages of some cells are obviously shifted. Under this circumstance, the misjudgment probability is increased, and the data error rate is also increased.

SUMMARY OF THE INVENTION

The present invention provides a data compensating method for a flash memory. The misjudgment probability of the storing states of the cells of the flash memory can be determined according to the inter-cell interference (ICI). Accordingly, the storing states of the central cells corresponding to the ICI pattern are compensated, and thus the data error rate is reduced.

An embodiment of the present invention provides a data compensating method for a flash memory. The flash memory includes a plurality of cells. Each cell has a first storing state or a second storing state. The first storing state has a low voltage level, and the second storing state having a high voltage level. The data compensating method includes the following steps. Firstly, a first threshold voltage distribution curve of the cells of the flash memory with a first storing state is acquired. Then, a second threshold voltage distribution curve of the cells of the flash memory with a second storing state is acquired. The first threshold voltage distribution curve and the second threshold voltage distribution curve are adjacent to each other. Then, a statistic voltage range is set. Then, a first occurrence probability of a first type ICI pattern of the first storing state is calculated according to the statistic voltage range and the first threshold voltage distribution curve. A second occurrence probability of the first type ICI pattern of the second storing state is acquired according to the statistic voltage range and the second threshold voltage distribution curve. During a read cycle, storing states of central cells corresponding to the first type ICI pattern are compensated according to the first occurrence probability and the second occurrence probability.

Another embodiment of the present invention provides a data compensating method for a flash memory. The flash memory includes a plurality of cells. Each cell has a first storing state or a second storing state. The first storing state has a first threshold voltage distribution curve. The second storing state has a second threshold voltage distribution curve. The data compensating method includes following steps. Firstly, a statistic voltage range is set. The statistic voltage range is between a median threshold voltage of the first threshold voltage distribution curve and a median threshold voltage of the second threshold voltage distribution curve. Then, a first occurrence probability of a first type ICI pattern of the first storing state corresponding to a threshold voltage within the statistic voltage range is calculated. Then, a second occurrence probability of the first type ICI pattern of the second storing state corresponding to the threshold voltage within the statistic voltage range is calculated. During a read cycle, storing states of central cells corresponding to the first type ICI pattern and having the threshold voltage within the statistic voltage range are compensated according to the first occurrence probability and the second occurrence probability.

Numerous objects, features and advantages of the present invention will be readily apparent upon a reading of the following detailed description of embodiments of the present invention when taken in conjunction with the accompanying drawings. However, the drawings employed herein are for the purpose of descriptions and should not be regarded as limiting.

BRIEF DESCRIPTION OF THE DRAWINGS

The above objects and advantages of the present invention will become more readily apparent to those ordinarily skilled in the art after reviewing the following detailed description and accompanying drawings, in which.

DETAILED DESCRIPTION OF PREFERRED EMBODIMENTS

In a flash memory, the threshold voltage of a central cell is usually influenced by the storing states of the neighboring cells. The interference generated by the neighboring cells is also referred as inter-cell interference (ICI). In accordance with the present invention, the statistics about the ICI patterns corresponding to the central cells are firstly gathered, and then the storing states of the central cells are compensated according to the ICI patterns with the higher misjudgment probability.

First of all, various ICI patterns of a MLC flash memory will be illustrated with reference to FIGS. 5A~5D. In a case that the central cell has the storing state E, the pattern of the storing states of the four cells at the top, bottom, left and right sides of the central cell may be considered as an ICI pattern of the storing state E.

Figure 5A:
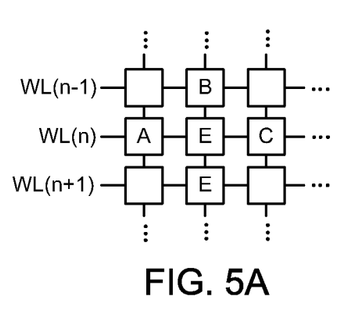
FIGS. 5A~5D schematically illustrate various ICI patterns of a MLC flash memory.
Figure 5B:
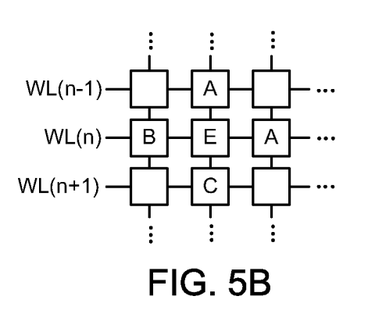
Figure 5C:
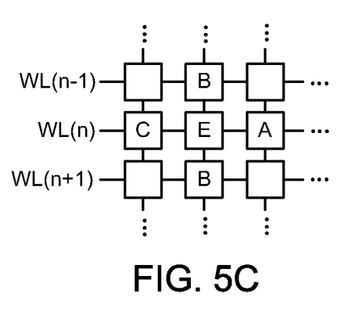
Figure 5D:
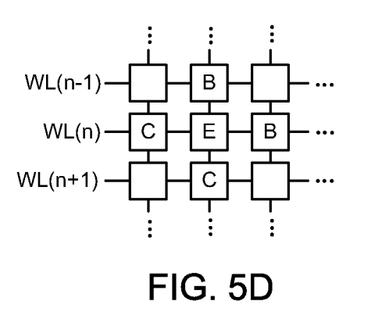

As shown in FIG. 5A, the top cell has the storing state B, the bottom cell has the storing state E, the left cell has the storing state A, and the right cell has the storing state C. As shown in FIG. 5B, the top cell has the storing state A, the bottom cell has the storing state C, the left cell has the storing state B, and the right cell has the storing state A. As shown in FIG. 5C, the top cell has the storing state B, the bottom cell has the storing state B, the left cell has the storing state C, and the right cell has the storing state A. As shown in FIG. 5D, the top cell has the storing state B, the bottom cell has the storing state C, the left cell has the storing state C, and the right cell has the storing state B.

In FIGS. 5A~5D, only four exemplary ICI patterns corresponding to the storing state E of the central cell are illustrated. In practice, each of the four cells at the top, bottom, left and right sides of the central cell with the storing state E have four possible storing states. That is, there are a total of 256 kinds of ICI patterns (i.e. 4×4×4×4=256) corresponding to the storing state E of the central cell. Similarly, there are a total of 256 kinds of ICI patterns corresponding to any other storing state of the central cell.

Of course, the cells to determine the ICI pattern corresponding to the central cell are not restricted to the top cell, the bottom cell, the left cell and the right cell. For example, the four cells at the top left side, the top right side, the bottom left side and the bottom right side of the central cell may be also included to determine the ICI pattern corresponding to the central cell. Alternatively, only some of the neighboring cells of the central cell may be employed to determine the ICI pattern corresponding to the central cell. For example, if only the storing states of the top cell, the left cell and the right cell are taken into consideration, there is a total of 64 kinds of ICI patterns (i.e. 4×4×4=64). For clarification and brevity, the ICI pattern determined by the top cell, the left cell and the right cell will be illustrated as follows.

For, a random data is programmed into a page of the MLC flash memory. If each page of the flash memory has 131,072 bits, the number of bits of each of the storing states E, A, B and C is about 32,768 (i.e. 131,072/4=32,768) on average. Since there are 64 kinds of ICI patterns corresponding to any storing state, the occurrence number of each kind of the identical ICI pattern corresponding to the central cell having the storing state E is about 512 (i.e. 32768/64=512) on average. Similarly, the occurrence number of each kind of the identical ICI pattern corresponding to the central cell having the storing state A, B or C is about 512 on average.

In an embodiment, the statistics about the threshold voltages and the ICI patterns corresponding to the central cells in different storing states are firstly gathered. For brevity, only two adjacent storing states are illustrated. As for the MLC flash memory, the two adjacent storing states include the storing states E and A, or the storing states A and B, or the storing states B and C.

Figure 6A:
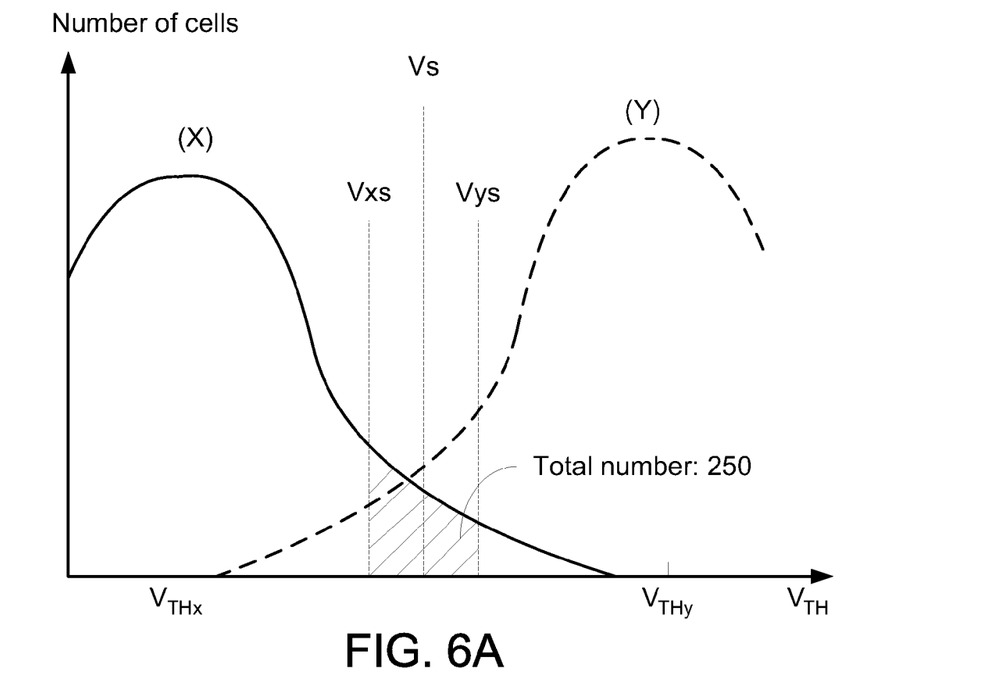
FIG. 6A schematically illustrates the threshold voltage distribution curve of the MLC flash memory in a first storing state (X)
Figure 6B:
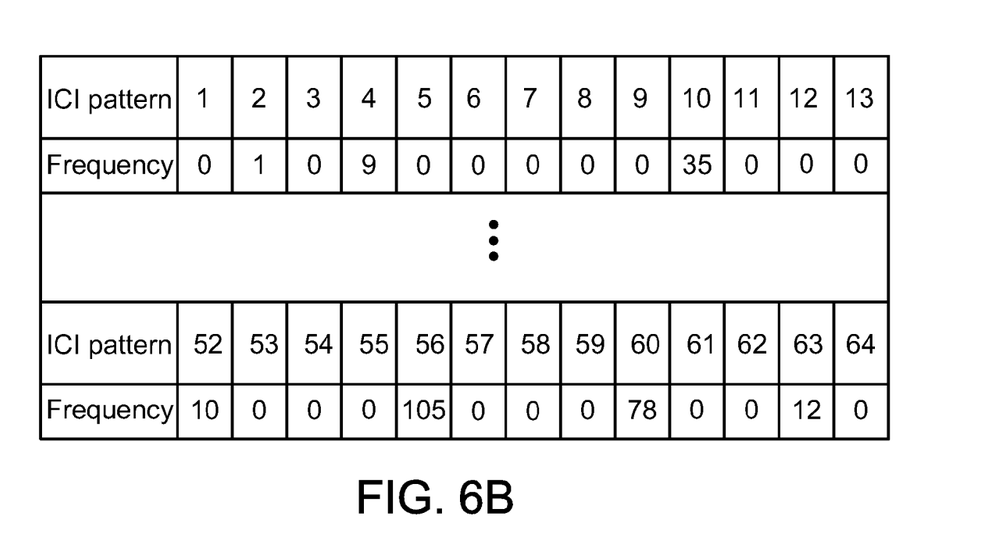
FIG. 6B is a table illustrating the statistics about the occurrence numbers of the ICI patterns corresponding to the cells having the first storing state (X) and having the threshold voltage within the statistic voltage range.

FIG. 6A schematically illustrates the threshold voltage distribution curve of the MLC flash memory in a first storing state (X). FIG. 6B is a table illustrating the statistics about the occurrence numbers of each kind of the ICI patterns corresponding to the cells having the first storing state (X) and having the threshold voltage within the statistic voltage range. As mentioned above, after the data are written into a page of the MLC flash memory, about 32,768 cells are in the first storing state (X). Most of the cells in the first storing state (X) have a median threshold voltage $V_{THX}$ (also referred as a first threshold voltage). Moreover, the occurrence number of each kind of the ICI patterns corresponding to the central cell having the first storing state (X) is about 512 on average. Moreover, during the read cycle, a slicing voltage Vs is used for distinguishing the first storing state (X) from the adjacent second storing state (Y).

Next, a statistic voltage range is defined according to the threshold voltage distribution curve of the first storing state (X) and the threshold voltage distribution curve of the second storing state (Y). For example, the statistic voltage range can be defined by shifting the slicing voltage Vs toward the first storing state (X) and the second storing state (Y) respectively. As shown in FIG. 6A, a first shift voltage Vxs is defined by shifting the slicing voltage Vs toward the first storing state (X) and is defined as the lower limit of the statistic voltage range, and a second shift voltage Vys is defined by shifting the slicing voltage Vs toward the second storing state (Y) and is defined as the upper limit of the statistic voltage range. In other words, the slicing voltage Vs lies within the statistic voltage range. As shown in FIG. 6A, the slicing voltage Vs lies between the first shift voltage Vxs and the second shift voltage Vys.

Then, the statistics about the occurrence numbers of the ICI patterns corresponding to the cells having the first storing state (X) and having the threshold voltage within the statistic voltage range are gathered. As shown in FIGS. 6A and 6B, it is assumed that the number of cells having the first storing state (X) and having the threshold voltage within the statistic voltage range is 250.

As shown in FIG. 6B, the statistics about the occurrence numbers of the ICI patterns corresponding to the 250 cells having the first storing state (X) and having the threshold voltage within the statistic voltage range are gathered. From the above discussions, there are 64 kinds of ICI patterns (or 64 cases) corresponding to the central cells having the first storing state (X). According to the statistic result as shown in FIG. 6B, if the central cell has the first storing state (X) and its threshold voltage lies within the statistic voltage range, the occurrence number of the second ICI pattern is 1, the occurrence number of the fourth ICI pattern is 9, the occurrence number of the tenth ICI pattern is 35, the occurrence number of the fifty-second ICI pattern is 10, the occurrence number of the fifty-sixth ICI pattern is 105, the occurrence number of the sixtieth ICI pattern is 78, the occurrence number of the sixty-third ICI pattern is 12, and the occurrence number of the other kinds of ICI patterns is 0.

Furthermore, the occurrence probability of the n-th kind of ICI pattern corresponding to the cells having the first storing state (X) and having the threshold voltage within the statistic voltage range may be defined as $P_{X,n}$. In other words, the occurrence probability $P_{X,n}$ is equal to the number of the n-th kind of ICI pattern corresponding to the cells having the first storing state (X) and having the threshold voltage within the statistic voltage range divided by the number of the n-th kind of ICI pattern corresponding to the cells having the first storing state (X). By calculation, $P_{X,2}=(1/512)$; $P_{X,4}=(9/512)$; $P_{X,10}=(35/512)$; $P_{X,52}=(10/512)$; $P_{X,56}=(105/512)$; $P_{X,60}=(78/512)$; and $P_{X,63}=(12/512)$.

In this embodiment, the number of the n-th kind of ICI pattern corresponding to the cells having the first storing state (X) is calculated by average measurement after a random data is programmed into the flash memory. Alternatively, in some other embodiments, after a preset data is programmed into the flash memory, the number of the n-th kind of ICI pattern corresponding to the cells having the first storing state (X) is pre-defined in the preset data. In other words, by arranging and programming a preset data, the number of each kind of the ICI patterns corresponding to each of the storing states of the cells can be pre-defined.

Figure 6C:
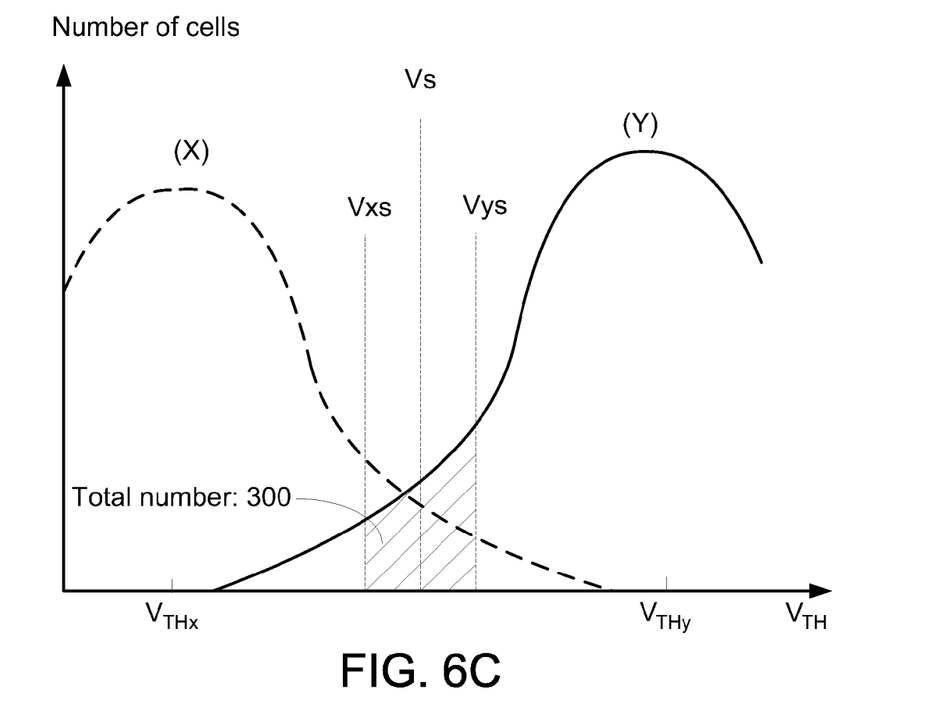
FIG. 6C schematically illustrates the threshold voltage distribution curve of the MLC flash memory in a second storing state (Y)
Figure 6D:
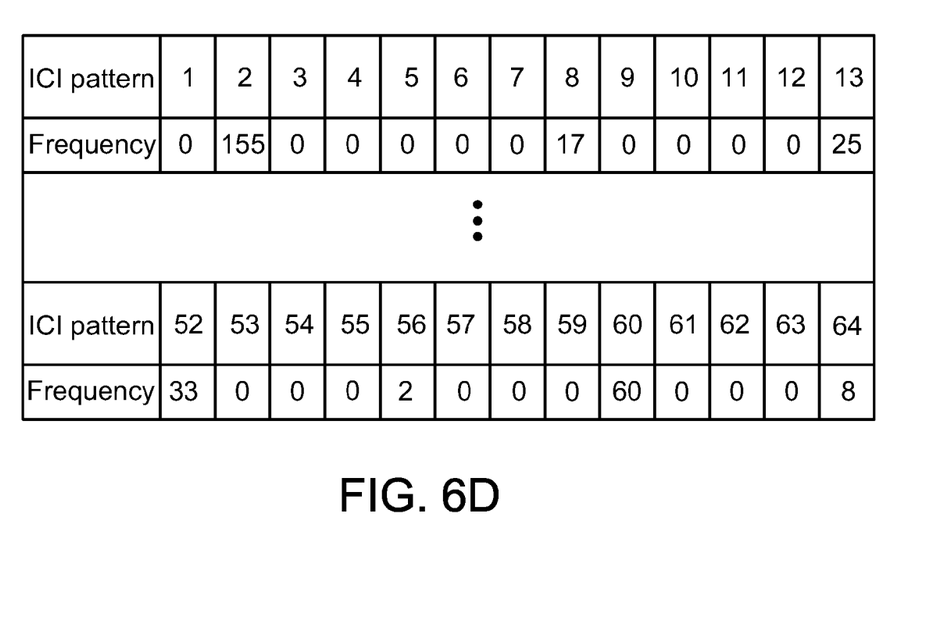
FIG. 6D is a table illustrating the statistics about the occurrence numbers of the ICI patterns corresponding to the cells having the second storing state (Y) and having the threshold voltage within the statistic voltage range.

FIG. 6C schematically illustrates the threshold voltage distribution curve of the MLC flash memory in a second storing state (Y). FIG. 6D is a table illustrating the statistics about the occurrence numbers of the ICI patterns corresponding to the cells having the second storing state (Y) and having the threshold voltage within the statistic voltage range. As mentioned above, after the data are written into a page of the MLC flash memory, about 32,768 cells are in the second storing state (Y). Most of the cells in the second storing state (Y) have a median threshold voltage $V_{THY}$ (also referred as a second threshold voltage). Moreover, the occurrence number of each kind of the ICI patterns corresponding to the central cell having the second storing state (Y) is about 512 on average.

Then, the statistics about the occurrence numbers of the ICI patterns corresponding to the cells having the second storing state (Y) and having the threshold voltage within the statistic voltage range are gathered. As shown in FIGS. 6C and 6D, it is assumed that the number of cells having the second storing state (Y) and having the threshold voltage within the statistic voltage range is 300.

As shown in FIG. 6D, the statistics about the occurrence numbers of the ICI patterns corresponding to the 300 cells having the second storing state (Y) and having the threshold voltage within the statistic voltage range are gathered. From the above discussions, there are 64 kinds of ICI patterns (or 64 cases) corresponding to the central cell having the second storing state (Y). According to the statistic result as shown in FIG. 6D, if the central cell has the second storing state (Y) and its threshold voltage lies within the statistic voltage range, the occurrence number of the second ICI pattern is 155, the occurrence number of the eighth ICI pattern is 17, the occurrence number of the thirteenth ICI pattern is 25, the occurrence number of the fifty-second ICI pattern is 33, the occurrence number of the fifty-sixth ICI pattern is 2, the occurrence number of the sixtieth ICI pattern is 60, the occurrence number of the sixty-fourth ICI pattern is 8, and the occurrence number of the other kinds of ICI patterns is 0.

Furthermore, the occurrence probability of the n-th kind of ICI pattern corresponding to the cells having the second storing state (Y) and having the threshold voltage within the statistic voltage range may be defined as $P_{Y,n}$. In other words, the occurrence probability $P_{Y,n}$ is equal to the number of the n-th kind of ICI pattern corresponding to the cells having the second storing state (Y) and having the threshold voltage within the statistic voltage range divided by the number of the n-th kind of ICI pattern corresponding to the cells having the second storing state (Y). By calculation, $P_{Y,2}=(155/512)$; $P_{Y,8}=(17/512)$; $P_{Y,13}=(25/512)$; $P_{Y,52}=(33/512)$; $P_{Y,56}=(2/512)$; $P_{Y,60}=(60/512)$ and $P_{Y,64}=(8/512)$.

In this embodiment, the number of the n-th kind of ICI pattern corresponding to the cells having the second storing state (Y) is calculated by average measurement after a random data is programmed into the flash memory. Alternatively, in some other embodiments, after a preset data is programmed into the flash memory, the number of the n-th kind of ICI pattern corresponding to the cells having the second storing state (Y) is pre-defined in the preset data.

Then, the occurrence probability of the n-th kind of ICI pattern corresponding to the cells having the first storing state (X) and having the threshold voltage within the statistic voltage range is compared with the occurrence probability of the n-th kind of ICI pattern corresponding to the cells having the second storing state (Y) and having the threshold voltage within the statistic voltage range. For example, the occurrence probability $P_{X,56}$ of the 56-th kind of ICI pattern corresponding to the cells having the first storing state (X) and having the threshold voltage within the statistic voltage range is equal to 105/512, and the occurrence probability $P_{Y,56}$ of the 56-th kind of ICI pattern corresponding to the cells having the second storing state (Y) and having the threshold voltage within the statistic voltage range is equal to 2/512. Since the occurrence probability $P_{X,56}$ is higher than the occurrence probability $P_{Y,56}$, the central cell with the threshold voltage within the statistic voltage range and corresponding to the 56-th kind of ICI pattern has a higher probability to be in the first storing state (X).

Similarly, the occurrence probability $P_{X,2}$ of the second kind of ICI pattern corresponding to the cells having the first storing state (X) and having the threshold voltage within the statistic voltage range is equal to 1/512, and the occurrence probability $P_{Y,2}$ of the second kind of ICI pattern corresponding to the cells having the second storing state (Y) and having the threshold voltage within the statistic voltage range is equal to 155/512. Since the occurrence probability $P_{X,2}$ is lower than the occurrence probability $P_{Y,2}$, the central cell with the threshold voltage within the statistic voltage range and corresponding to the second kind of ICI pattern has a higher probability to be in the second storing state (Y).

Figure 7:
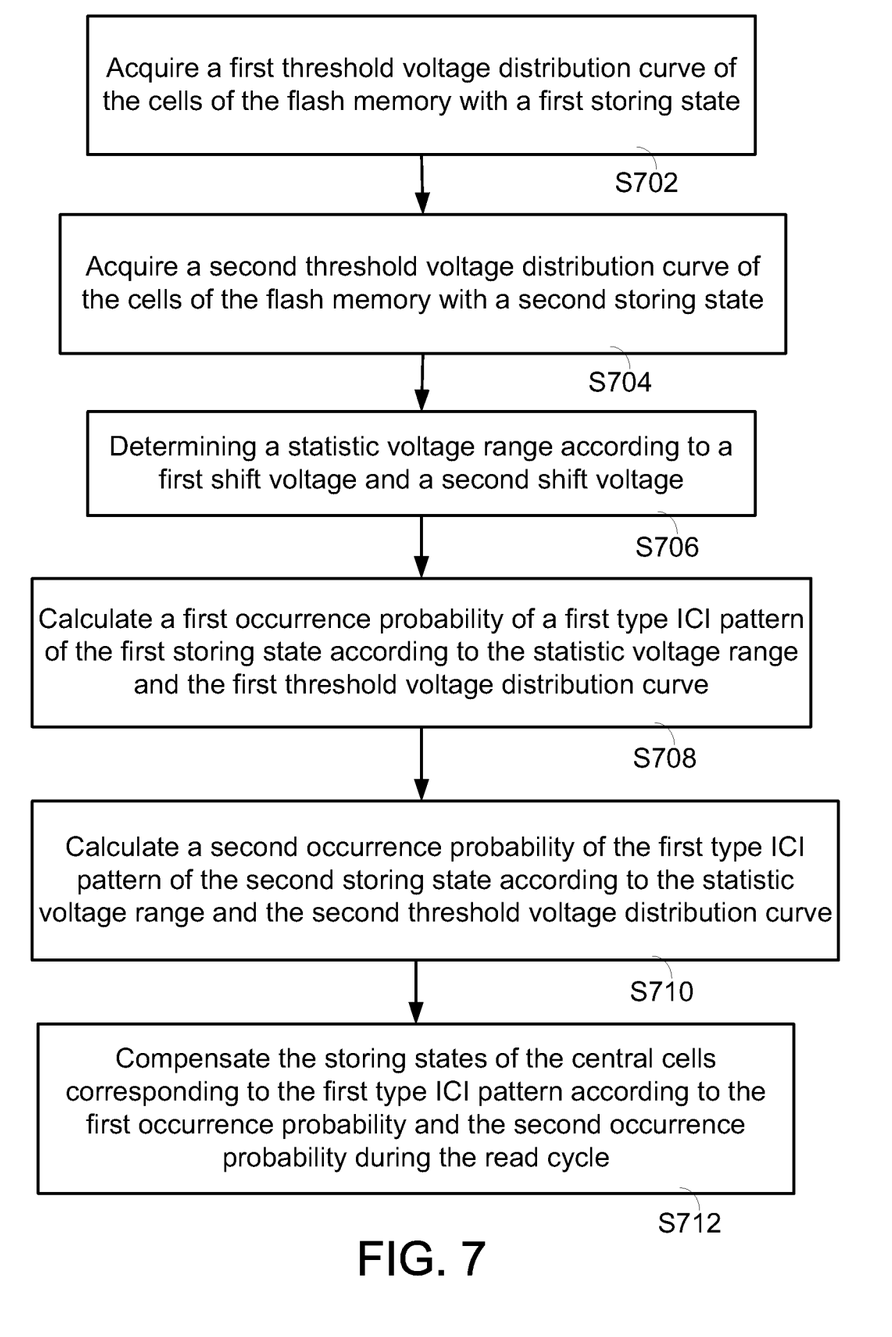
FIG. 7 is a flowchart illustrating a data compensating method for a flash memory according to an embodiment of the present invention.

According to the above concepts, the present invention provides a data compensating method for reducing the data error rate. FIG. 7 is a flowchart illustrating a data compensating method for a flash memory according to an embodiment of the present invention.

Firstly, a first threshold voltage distribution curve of the cells of the flash memory with a first storing state is acquired (Step S702). In this step, the number of the central cells with the first storing state and a first type ICI pattern can be calculated. From the above discussions, the number of the central cells with the first storing state and the first type ICI pattern is about 512. In addition, the first type ICI pattern is for example the 56-th kind of ICI pattern.

Then, a second threshold voltage distribution curve of the cells of the flash memory with a second storing state is acquired (Step S704). In this step, the number of the central cells with the second storing state and the first type ICI pattern can be calculated. From the above discussions, the number of the central cells with the second storing state and the first type ICI pattern is about 512. Similarly, the first type ICI pattern is for example the 56-th kind of ICI pattern.

Then, a slicing voltage Vs for distinguishing the first storing state from the second storing state is defined. In addition, a first shift voltage Vxs smaller than the slicing voltage Vs and a second shift voltage Vys larger than the slicing voltage Vs are used to determine a statistic voltage range (Step S706).

Then, a first occurrence probability of the first type ICI pattern corresponding to the first storing state is calculated according to the statistic voltage range and the first threshold voltage distribution curve (Step S708). For example, the first occurrence probability is the occurrence probability $P_{X,56}$ (=105/512).

Then, a second occurrence probability of the first type ICI pattern of the second storing state is calculated according to the statistic voltage range and the second threshold voltage distribution curve (Step S710). For example, the second occurrence probability is the occurrence probability $P_{Y,56}$ (=2/512).

Then, during the read cycle, the storing states of the central cells corresponding to the first type ICI pattern are compensated according to the first occurrence probability and the second occurrence probability (Step S712). That is, according to the first occurrence probability and the second occurrence probability, the storing states of the central cells corresponding to the first type ICI pattern are checked if need to be changed from the first storing state to the second storing state or from the second storing state to the first storing state.

Moreover, the steps S702~S710 may be performed before the flash memory leaves the factory. Consequently, the occurrence probability values of different types of ICI patterns corresponding to different storing states can be previously obtained and stored. After the flash memory leaves the factory, the data compensating action of the step S712 may be performed according to the above stored occurrence probability values.

Figure 8A:
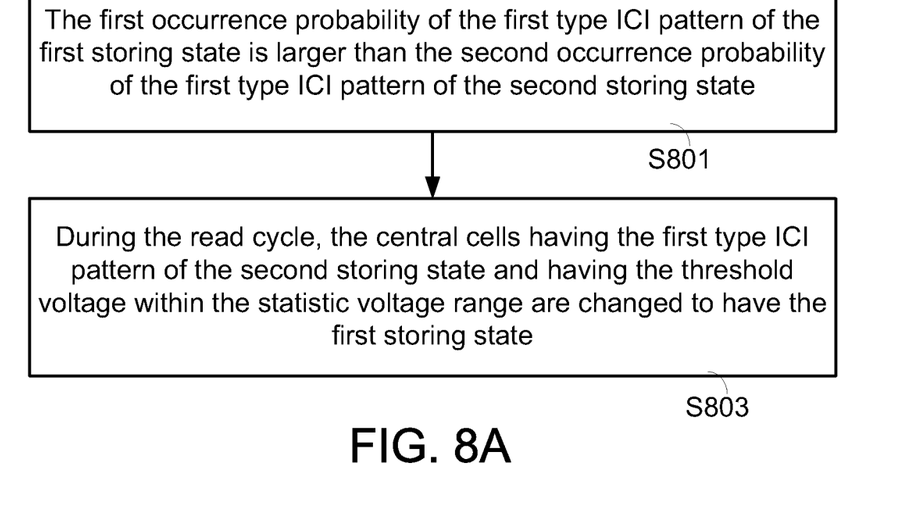
FIGS. 8A and 8B schematically illustrate an approach of performing the data compensating action according to occurrence probability values by the data compensating method of the present invention.
Figure 8B:
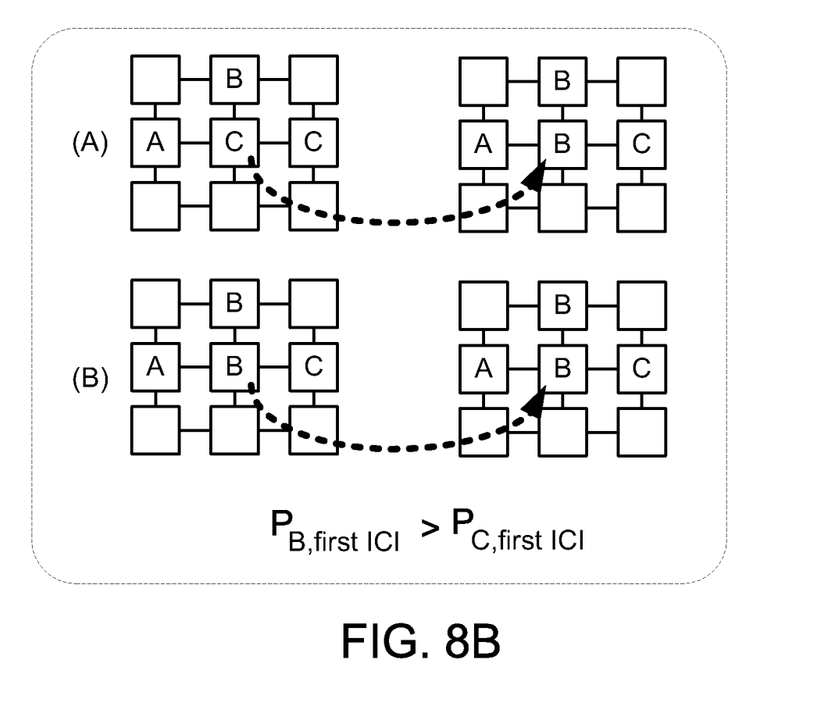

FIGS. 8A and 8B schematically illustrate an approach of performing the data compensating action according to occurrence probability values by the data compensating method of the present invention. According to the statistic result of the step S702~S710, the first occurrence probability of the first type ICI pattern of the first storing state is larger than the second occurrence probability of the first type ICI pattern of the second storing state (Step S801). During the read cycle, the central cells having the first type ICI pattern of the second storing state and having the threshold voltage within the statistic voltage range are changed to have the first storing state (Step S803).

For example, as shown in FIG. 8B, the first storing state is the storing state B, and the second storing state is the storing state C. In a case that the storing states of the top cell, the left cell and the right cell are respectively the storing states B, A and C, the first type ICI pattern corresponding to the center cell is defined. It is assumed that the first occurrence probability of the first type ICI pattern of the storing state B is larger than the second occurrence probability of the first type ICI pattern of the storing state C according to the statistic result. That is, $P_{B, first\ ICI} > P_{C, first\ ICI}$.

In the situation (A) of FIG. 8B, since the storing state of the central cell having the first type ICI pattern and having the threshold voltage within the statistic voltage range is the storing state C during the read cycle, the storing state of the central cell is changed from the storing state C to the storing state B. In the situation (B) of FIG. 8B, since the storing state of the central cell having the first type ICI pattern and having the threshold voltage within the statistic voltage range is the storing state B during the read cycle, the storing state of the central cell is maintained in the storing state B.

Please refer to FIGS. 6A~6D again. In a case that the threshold voltage lies within the statistic voltage range, the occurrence probability $P_{X,56}$ of the 56-th kind of ICI pattern of the first storing state (X) is 105/512, and the occurrence probability $P_{Y,56}$ of the 56-th kind of ICI pattern of the second storing state (Y) is 2/512. Consequently, if the threshold voltage is within the statistic voltage range during the read cycle, the central cells having the 56-th kind of ICI pattern of the second storing state (Y) are changed to have the first storing state (X).

Similarly, in a case that the threshold voltage lies within the statistic voltage range, the occurrence probability $P_{X,2}$ of the second kind of ICI pattern of the first storing state (X) is 1/512, and the occurrence probability $P_{Y,2}$ of the second kind of ICI pattern of the second storing state (Y) is 155/512. Consequently, if the threshold voltage is within the statistic voltage range during the read cycle, the central cells having the second kind of ICI pattern corresponding to the first storing state (X) are changed to have the second storing state (Y). The information about the storing states will be further provided to a decoding unit (not shown).

In the above embodiments, the timing of changing the storing state of the central cell is determined according to the comparison between the first occurrence probability and the second occurrence probability. It is noted that the numerous modifications and alterations may be made while retaining the teachings of the invention. In an embodiment, the timing of changing the storing state of the central cell is determined according to a formula. For example, if the value of $P_{X,56} \times (1-P_{Y,56})$ is larger than a first predetermined value, the central cells corresponding to the 56-th kind of ICI pattern of the second storing state are changed to have the first storing state. The information about the storing states will be further provided to a hard decoding unit, so that a data correcting operation is performed by the hard decoding unit. For example, the hard decoding unit is a BCH decoding unit. Alternatively, the flash memory may provide a near-first storing state indicator to a soft decoding unit (not shown), so that a data correcting operation is performed by the soft decoding unit. For example, the soft decoding unit is a LDPC error correction decoding unit or a soft BCH decoding unit.

Similarly, if the value of $P_{Y,2} \times (1-P_{X,2})$ is larger than a second predetermined value, the central cells having the second kind of ICI pattern of the first storing state are changed to have the second storing state. The information about the storing states will be further provided to a hard decoding unit, so that a data correcting operation is performed by the hard decoding unit. Alternatively, a near-first storing state indicator is provided to a soft decoding unit (not shown), so that a data correcting operation is performed by the soft decoding unit. Of course, the first predetermined value may be identical to the second predetermined value.

From the above descriptions, the present invention provides a data compensating method for a flash memory. The misjudgment probability of the storing states of the cells of the flash memory can be determined according to the inter-cell interference (ICI). According to the misjudgment probability, the storing states of the central cells corresponding to the ICI pattern are compensated. Consequently, the data error rate is reduced.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A data compensating method for a flash memory, the flash memory comprising a plurality of cells, each cell having a first storing state or a second storing state, the first storing state having a low voltage level, the second storing state having a high voltage level, the data compensating method comprising steps of:
acquiring a first threshold voltage distribution curve of the cells of the flash memory with a first storing state;
acquiring a second threshold voltage distribution curve of the cells of the flash memory with a second storing state, wherein the first threshold voltage distribution curve and the second threshold voltage distribution curve are adjacent to each other;
setting a statistic voltage range;

calculating a first occurrence probability of a first type ICI pattern of the first storing state according to the statistic voltage range and the first threshold voltage distribution curve;

calculating a second occurrence probability of the first type ICI pattern of the second storing state according to the statistic voltage range and the second threshold voltage distribution curve; and compensating storing states of central cells corresponding to the first type ICI pattern according to the first occurrence probability and the second occurrence probability during a read cycle;

wherein the calculation of the first occurrence probability comprises steps of: acquiring a first number of the central cells corresponding to the first type ICI pattern according to the first threshold voltage distribution curve; acquiring a second number of the central cells corresponding to the first type ICI pattern and having a threshold voltage within the statistic voltage range according to the first threshold voltage distribution curve and the statistic voltage range; and dividing the second number by the first number, thereby acquiring the first occurrence probability.

2. The data compensating method as claimed in claim 1, wherein if a product of the first occurrence probability and one minus the second occurrence probability is larger than a first predetermined value, the central cells corresponding to the first type ICI pattern are changed from the second storing state to the first storing state, and a data correcting operation is performed by a hard decoding unit.

3. The data compensating method as claimed in claim 1, wherein if a product of the first occurrence probability and one minus the second occurrence probability is larger than a first predetermined value, the data compensating method further comprises a step of providing a near-first storing state indicator to a soft decoding unit, wherein a data correcting operation is performed by the soft decoding unit.

4. The data compensating method as claimed in claim 1, wherein if the first occurrence probability is larger than the second occurrence probability, the central cells corresponding to the first type ICI pattern are changed from the second storing state to the first storing state, and a data correcting operation is performed by a hard decoding unit.

5. The data compensating method as claimed in claim 1, wherein if the first occurrence probability is larger than the second occurrence probability, the data compensating method further comprises a step of providing a near-first storing state indicator to a soft decoding unit, wherein a data correcting operation is performed by the soft decoding unit.

6. The data compensating method as claimed in claim 1, further comprising steps of:

acquiring a third number of the central cells corresponding to the first type ICI pattern according to the second threshold voltage distribution curve;

acquiring a fourth number of the central cells corresponding to the first type ICI pattern and having a threshold voltage within the statistic voltage range according to the second threshold voltage distribution curve and the statistic voltage range; and dividing the fourth number by the third number, thereby acquiring the second occurrence probability.

7. The data compensating method as claimed in claim 1, wherein a slicing voltage for distinguishing the first storing state from the second storing state lies within the statistic voltage range.

8. A data compensating method for a flash memory, the flash memory comprising a plurality of cells, each cell having a first storing state or a second storing state, the first storing state having a first threshold voltage distribution curve, the second storing state having a second threshold voltage distribution curve, the data compensating method comprising steps of:

setting a statistic voltage range, wherein the statistic voltage range is between a first median threshold voltage of the first threshold voltage distribution curve and a second median threshold voltage of the second threshold voltage distribution curve;

calculating a first occurrence probability of a first type ICI pattern of the first storing state corresponding to a threshold voltage within the statistic voltage range;

calculating a second occurrence probability of the first type ICI pattern of the second storing state corresponding to the threshold voltage within the statistic voltage range; and compensating storing states of central cells corresponding to the first type ICI pattern and having the threshold voltage within the statistic voltage range according to the first occurrence probability and the second occurrence probability during a read cycle;

wherein the calculation of the first occurrence probability comprises steps of: acquiring a first number of the central cells corresponding to the first type ICI pattern according to the first threshold voltage distribution curve; acquiring a second number of the central cells corresponding to the first type ICI pattern and having a threshold voltage within the statistic voltage range according to the first threshold voltage distribution curve and the statistic voltage range; and dividing the second number by the first number, thereby acquiring the first occurrence probability.

9. The data compensating method as claimed in claim 8, further comprising steps of:

acquiring a third number of the central cells corresponding to the first type ICI pattern according to the second threshold voltage distribution curve;

acquiring a fourth number of the central cells corresponding to the first type ICI pattern and having a threshold voltage within the statistic voltage range according to the second threshold voltage distribution curve and the statistic voltage range; and dividing the fourth number by the third number, thereby acquiring the second occurrence probability.

10. The data compensating method as claimed in claim 8, wherein a slicing voltage for distinguishing the first storing state from the second storing state lies within the statistic voltage range.

11. The data compensating method as claimed in claim 8, wherein if a product of the first occurrence probability and one minus the second occurrence probability is larger than a first predetermined value, the central cells corresponding to the first type ICI pattern and having the threshold voltage within the statistic voltage range are changed from the second storing state to the first storing state.

12. The data compensating method as claimed in claim 8, wherein if the first occurrence probability is larger than the second occurrence probability, the central cells corresponding to the first type ICI pattern and having the threshold voltage within the statistic voltage range are changed from the second storing state to the first storing state.

13. The data compensating method as claimed in claim 8, wherein if the first occurrence probability is larger than the second occurrence probability, the data compensating method further comprises a step of providing a near-first storing state indicator to a soft decoding unit, wherein a data correcting operation is performed by the soft decoding unit.

* * * * *